(12) United States Patent
Kumari et al.

(10) Patent No.: US 9,048,432 B2
(45) Date of Patent: Jun. 2, 2015

(54) PERYLENEBISIMIDE-POLYESTER BLEND

(75) Inventors: Asha Syama Kumari, Pune (IN); Nisha Simon Kumari, Pune (IN)

(73) Assignee: COUNCIL OF SCIENTIFIC & INDUSTRIAL RESEARCH, New Delhi (IN)

( * ) Notice: Subject to any disclaimer, the term of this patent is extended or adjusted under 35 U.S.C. 154(b) by 0 days.

(21) Appl. No.: 13/985,187

(22) PCT Filed: Feb. 14, 2012

(86) PCT No.: PCT/IN2012/000100
§ 371 (c)(1),
(2), (4) Date: Aug. 13, 2013

(87) PCT Pub. No.: WO2012/111026
PCT Pub. Date: Aug. 23, 2012

(65) Prior Publication Data
US 2013/0324679 A1 Dec. 5, 2013

(30) Foreign Application Priority Data
Feb. 14, 2011 (IN) .......................... 0370/DEL/2011

(51) Int. Cl.
| | | |
|---|---|---|
| *H01L 51/00* | (2006.01) | |
| *C08G 63/685* | (2006.01) | |
| *C08G 63/00* | (2006.01) | |
| *C08G 63/91* | (2006.01) | |
| *C08G 63/199* | (2006.01) | |
| *C08K 5/3437* | (2006.01) | |
| *H01L 51/50* | (2006.01) | |

(52) U.S. Cl.
CPC .......... *H01L 51/0043* (2013.01); *C08K 5/3437* (2013.01); *H01L 51/004* (2013.01); *H01L 51/0053* (2013.01); *H01L 51/5012* (2013.01); *Y02E 10/549* (2013.01); *C08G 63/6856* (2013.01); *C08G 63/199* (2013.01); *C08G 63/916* (2013.01)

(58) Field of Classification Search
CPC .............. C08G 63/199; C08G 63/6856; C08G 63/916; H01L 51/0043; H01L 51/0053; H01L 51/004; H01L 51/5012; C08K 5/3437; Y02E 10/549
USPC ........................................................ 525/437
See application file for complete search history.

(56) References Cited

U.S. PATENT DOCUMENTS

| | | | |
|---|---|---|---|
| 5,920,429 A | 7/1999 | Burns et al. | |
| 2010/0043878 A1 * | 2/2010 | Bhaumik et al. | 136/257 |
| 2010/0043880 A1 | 2/2010 | Bhaumik et al. | |

FOREIGN PATENT DOCUMENTS

WO       WO 2011036075 A1 *     3/2011

OTHER PUBLICATIONS

Takana et al.; "Photodegradation of polymer-dispersed perylene di-imide dyes"; Applied Optics Optical Society of America; Washington, DC; US, vol. 45, No. 16, Jun. 2006, pp. 3846-3851.
Notification of Transmittal of the International Preliminary Report on Patentability for PCT/IN2012/000100; Dated Feb. 22, 2013.

* cited by examiner

*Primary Examiner* — Randy Gulakowski
*Assistant Examiner* — Christopher M Rodd
(74) *Attorney, Agent, or Firm* — Abelman, Frayne & Schwab

(57) ABSTRACT

The present invention provides a perylenebisimide-polyester copolymer and a transesterification process for the preparation thereof. The perylenebisimide-polyester copolymer prepared is useful in organic light emitting diodes, solar cells and such other photovoltaic applications.

6 Claims, 11 Drawing Sheets

US 9,048,432 B2

PERYLENEBISIMIDE-POLYESTER BLEND

FIELD OF THE INVENTION

This invention relates to a polymer composition useful in organic light emitting diodes (OLEDs) and solar cells and a process for the preparation thereof.

BACKGROUND AND PRIOR ART

Organic semiconductors based on molecular and polymeric materials have been in wide use in electronics industry for the last 30 years as a complement to the shortcomings of inorganic semiconductors. Importantly, organic semiconductors offer, when compared to the inorganic-based technology, greater ease in device processability, flexibility, substrate compatibility, and reduced cost; as well as facile tuning of the frontier molecular orbital energies by molecular design.

Field-effect transistor (FET) is a key device used in the electronic industry, which is based on inorganic electrodes, insulators, and semiconductors. FETs based on organic semiconductors (OFET) are finding its applications in low-performance memory elements as well as in integrated optoelectronic devices, such as pixel drive and switching elements in active-matrix organic light-emitting diode (LED) displays.

Earlier attempts from other research groups at incorporating perylenebisimide (PBI) into devices included chemical vapor deposition which is a highly costly process and not all small molecules can be fabricated into devices by this method. Mono- and diimideperylene and naphthalene compounds, N- and core-substituted with electron-withdrawing groups, for use in the fabrication of various device structures are disclosed in U.S. Pat. No. 7,671,202.

Organic field effect transistors (OFETS) operable in p-type mode are more well-known compared to n-type ones. Among the few n-type organic semiconductors used, those based on diimides like perylene or naphthalene diimide are the most investigated ones. However, such compounds have been found to have issues of insolubility which make them unfavorable in device fabrication.

An alternate method involves the transesterification of perylene bisimide derivatives with polymers so as to obtain spin coatable films, but this method also suffered from phase separation problems.

Other methods of developing Perylenebisimide based main chain homopolymers and copolymers, have also not been very successful as they are usually highly rigid, insoluble and low-molecular weight materials which cannot form free-standing films.

Article titled "Mechanistic Aspects of Ester-Carbonate Exchange in Polycarbonate/Cycloaliphatic Polyester with Model Reactions" published 16 Mar. 2004 by M. JAYAKANNAN discloses reactive blending of bisphenol A polycarbonate (PC) with poly(1,4-cyclohexanedimethylene-1,4-cyclohexanedicarboxylate) (PCCD).

Article titled "Molecular semiconductor blends: Microstructure, charge carrier transport, and application in photovoltaic cells" [Phys. Status Solidi A 206, No. 12, 2683-2694 (2009)] disclose blends of two electroluminescent materials oligothiophene and a perylene derivative which are useful as light-emitting OFETs.

Article titled "Sequestration of electroactive materials in a high Tg, insulating polymer matrix for optoelectronic applications. Part 2. Photovoltaic devices" Jiang et. al in Polymer, vol. 47, pp. 4124-4131(2006)]. incorporation of high levels of electroactive compounds into a high Tg matrix polymer and combination of electron donor-electron acceptor pairs with optionally light harvesting organics (e.g. laser dyes) in the high Tg polymer matrix yielded Photovoltaic (PV) performance in the range of literature data typically reported for organic based PV devices.

In light of the above, it is an object of the present invention to provide n-type semiconductor compounds and process for preparation and methods of their use, that overcome various deficiencies and shortcomings of the prior art outlined as above. While various copolymers of PBI with other molecules such as oligothiophene and the copolymer of PCCD with polycarbonate are known in the art, however, the transesterification of PCCD with PBI is hitherto undisclosed.

OBJECTIVE OF THE PRESENT INVENTION

The main objective of the present invention is to provide a polymer composition useful in organic light emitting diodes (OLEDs) and solar cells.

The another objective of the present invention is to provide a process for the preparation of polymer composition.

SUMMARY OF THE INVENTION

According, the present invention provides a polymer composition comprising a polyester and perylenebisimide in a ratio in the range of 0.01:99.99 to 99.99:0.01.

In one embodiment of the invention, said polyester is Poly (1,4-cyclohexylenedimethylene-1,4-cyclohexanedicarboxylate).

In another embodiment of the invention, said composition is soluble in halogenated solvents.

In another embodiment of the invention, the polymer composition comprising Poly(1,4 cyclohexylenedimethylene-1,4-cyclohexanedicarboxylate) to perylenebisimide in the ratio 90:10 to 10:90 forms a film.

Yet another embodiment of the invention provides a process for the preparation of a polymer composition comprising the steps of:
a. dissolving a polyester in a solvent by heating to 150 to 180° C.;
b. adding perylenebisimide (PBI) diol to the solution of step (a);
c. stirring the mixture of step (b) for 10-12 hours;
d. adding Ti(OBu)$_4$ to the solution of step (c) and continuing the reaction with stirring at 180 to 190° C. for 20 to 24 hrs to obtain a perylenebisimide-polyester copolymer;
e. cooling the perylenebisimide-polyester copolymer as obtained in step (d) followed by adding dichloromethane and subsequently pouring the obtained polymer solution into excess of ethanol followed by washing with methanol and solvent extraction with acetone to obtain pure blend of polymer composition.

In another embodiment of the invention, the solvent used in step (a) is o-dichlorobenzene.

In another embodiment of the invention, the polyester used in step (a) is Poly(1,4-cyclohexylenedimethylene-1,4-cyclohexanedicarboxylate).

In another embodiment of the invention, the polymer composition comprises the thermoplastic polymer and perylenebisimide in the ratio 0.01:99.99 to 99.99:0.01.

ABBREVIATIONS

Figure 1:
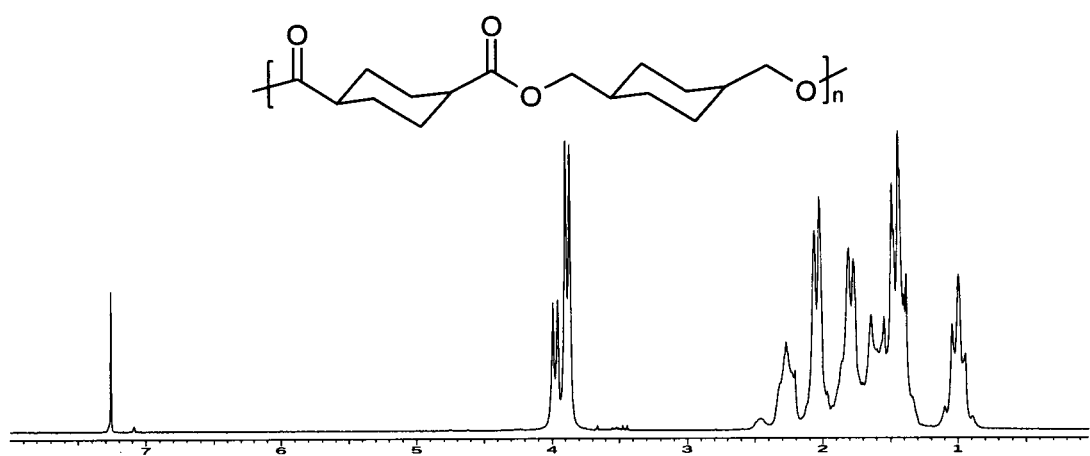
FIG. 1 depicts $^1$H NMR spectra of PCCD recorded in CDCl$_3$

PCCD: poly(1,4-cyclohexanedimethylene-1,4-cyclohexanedicarboxylate)
PBI: perylenebisimide
GPC: Gel Permeation Chromatography
NMR: Nuclear Magnetic Resonance
ODCB: O-dichlorobenzene

DETAILED DESCRIPTION

The invention will now be described in detail in connection with certain preferred and optional embodiments, so that various aspects thereof may be more fully understood and appreciated.

Polyesters are mostly used for engineering thermoplastics because of their excellent mechanical and thermal properties. Among them, poly(1,4-cyclohexanedimethylene-1,4-cyclohexanedicarboxylate) (PCCD) has attracted more attention in the plastic industry because of its outstanding properties such as chemical resistance and resistance to UV radiation.

Accordingly, in a preferred embodiment, the invention discloses PCCD/PBI copolymers for photovoltaic applications.

According to another embodiment, the invention provides a process for preparation of PCCD/PBI copolymer, which is achieved by the transesterification of hydroxyl group functionalized PBI derivatives with high molecular weight Poly(1,4-cyclohexylenedimethylene-1,4-cyclohexanedicarboxylate)(PCCD) and investigating with high-temperature solution-transesterification methodology to obtain film-forming PBI containing polymer.

A high temperature solution transesterification process to prepare this polymer is conducted in presence of a solvent (high boiling where both components dissolve, viz., o-dichlorobenzene, 1,1,2,2-tetracholoro ethane, high boiling halogenated hydrocarbons) and a catalyst. The catalyst is preferably selected from the group comprising of titanium, exemplified herein as Ti(OBu)$_4$ A polymer/PBI composition varies in the range of 0.01:99.99 to 99.99-0.01. The polymer is commercial engineering thermoplastic polyester, preferably PCCD.

The hydroxyl group functionalized PBI derivatives are selected from PBI diol, where the hydroxyl group is attached to linear aliphatic spacers like —(CH2)n-.

The synthesis of PBI containing polymer is shown below in scheme 1.
Scheme 1
The PBI containing polymer thus obtained was further evaluated for its applications in OLED and solar cells.

Different compositions of PCCD/PBI blends were prepared and they were subjected to solvent extraction to remove unreacted PBI that would be physically trapped in the polymer voids.

In another embodiment, the compositional analysis of the PCCD/PBI was performed with proton NMR and the molecular weights were determined using gel permeation chromatography (GPC). The GPC of the copolymer after solvent extraction showed the disappearance of the peak corresponding to unreacted PBI. The formation of the new trans-ester linkage involving PBI was further confirmed by shift of the —CH$_2$—OH proton in the proton NMR spectra, which transformed into the new —CH$_2$—O—COR linkage. Thus, the current invention is able to demonstrate successfully, the synthesis of a highly soluble film forming PCCD/PBI copolymer which is anticipated to be a key step towards fabricating easily processable novel PBI polymer for photovoltaic applications.

The protocol of the current invention is extendable to other types of 'n' type materials, for instance based on napthalenebisimide and also to 'p' type (hole transporting) materials (eg. oligothiophene). A free standing film containing both electron and hole transporting material which could also be incorporated with self-assembling elements like hydrogen bonding or pi stacking could solve the bridge between ideal materials which perform ideally individually but phase separate when used together in a device.

In accordance with the above object, the present invention provides Perylenebisimide (PBI) derivatives, important photoactive materials that are successfully used in organic light emitting diodes (OLEDs) and solar cells.

In one aspect, the invention discloses reactive transesterification of hydroxyl group functionalized PBI derivatives with high molecular weight Poly(1,4-cyclohexylenedimethylene-1,4-cyclohexanedicarboxylate) (PCCD) to obtain a film-forming PBI containing polymer.

Accordingly, a semicrystalline polyester such as PCCD [Poly(1,4-cyclohexylenedimethylene-1,4-cyclohexanedicarboxylate)], as a representative engineering polyester is taken and a reactive transesterification is carried out with an n-type (electron transporting) perylenebisimide (PBI) derivative (without the risk of phase separation) resulting in free-standing films containing PBI which can be directly used in photovoltaic devices. Perylenebisimide (PBI) derivatives according to the invention are hydroxyl group functionalized.

Transesterification was achieved using transesterification catalysts and chemical incorporation of perylenebisimide into the PCCD backbone was proven by proton NMR spectroscopy.

Chemical incorporation of PBI into PCCD was not achievable in the absence of the transesterification catalyst.

Different compositions of PCCD/PBI blends were prepared and they were subjected to solvent extraction to remove unreacted PBI that would be physically trapped in the polymer voids.

In another aspect, the compositional analysis of the PCCD/PBI films was performed with proton NMR spectroscopy and the molecular weights were determined using gel permeation chromatography (GPC).

In yet another aspect, the composition of the invention is soluble in halogenated solvent selected from chloroform, dichloromethane, 1,2-dichloroethane, carbon tetrachloride and such like. As exemplified herein, the composition is dissolved in CDCl$_3$ for NMR measurements and in chloroform for GPC.

EXAMPLES

Example 1

Synthesis of PCCD/PBI Blend(B91)

PCCD (2.520 g, 9 mmol) was dissolved in ODCB (O-dichlorobenzene) (5 mL) by heating to 150° C. in an oil bath. To the clear solution, PBI diol (1.083 g, lmmol) was added. The mixture was stirred continuously for 12 hrs using an overhead mechanical stirrer at a constant rate of 100 rpm. To the solution, $Ti(OBu)_4$ (34 mg, 1 mol %) was added and the reactive transesterification was continued with stirring at 180° C. for 24 hrs. The PCCD/PBI blend was cooled, dichloromethane (10 m), was added, and the polymer solution was poured into excess of ethanol (500 mL). The resultant material was filtered and washed successively with methanol (200mL×3) and subjected to solvent extraction using acetone (250 mL). Yield=66.86%

Example 2

Synthesis of PCCD/PBI Blend (B82)

PCCD (2.240 g, 8 mmol) and PBI diol (2.166 g, 2 mmol) were reacted in the presence of Ti(OBu), (34 mg, 1 mol %) in ODCB as described for B91. Yield=61.36%

Example 3

Synthesis of PCCD/PBI Blend 73(B73)

PCCD (1.96 g, 7 mmol) and PBI diol (3.249 g, 3 mmol) were reacted in the presence of Ti(OBu), (34 mg, 1 mol %) in ODCB as described for B91. Yield=52.99%

Example 4

Synthesis of PCCD/PBI Blend II(BII)

PCCD (1.400 g, 5 mmol) and PDP diol (5.415 g, 5 mmol) were reacted in the presence of Ti(OBu), (34 mg, 1 mol %) in ODCB as described for B91. Yield=48.71%

Figure 2:
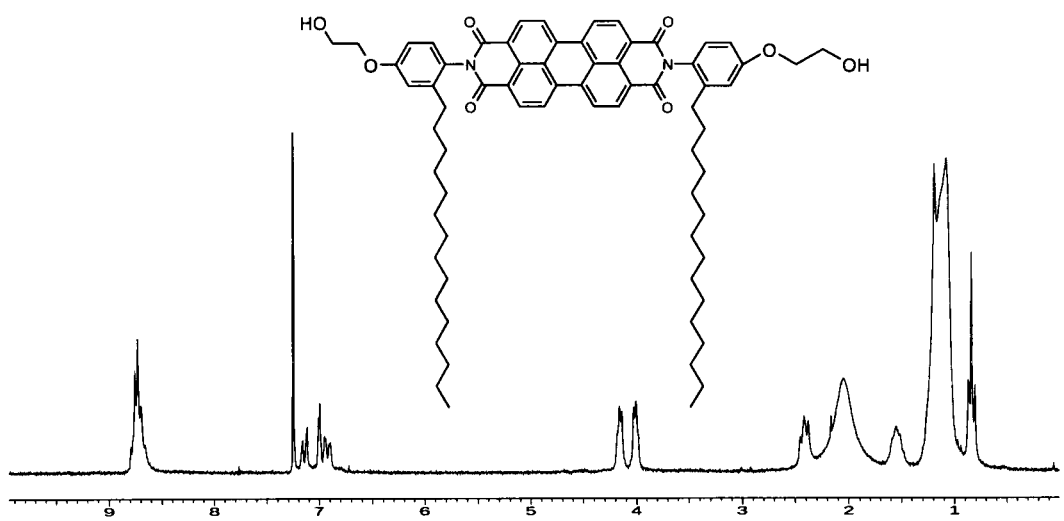
FIG. 2 depicts $^1$H NMR spectra of PBI diol recorded in CDCl$_3$
Figure 3:
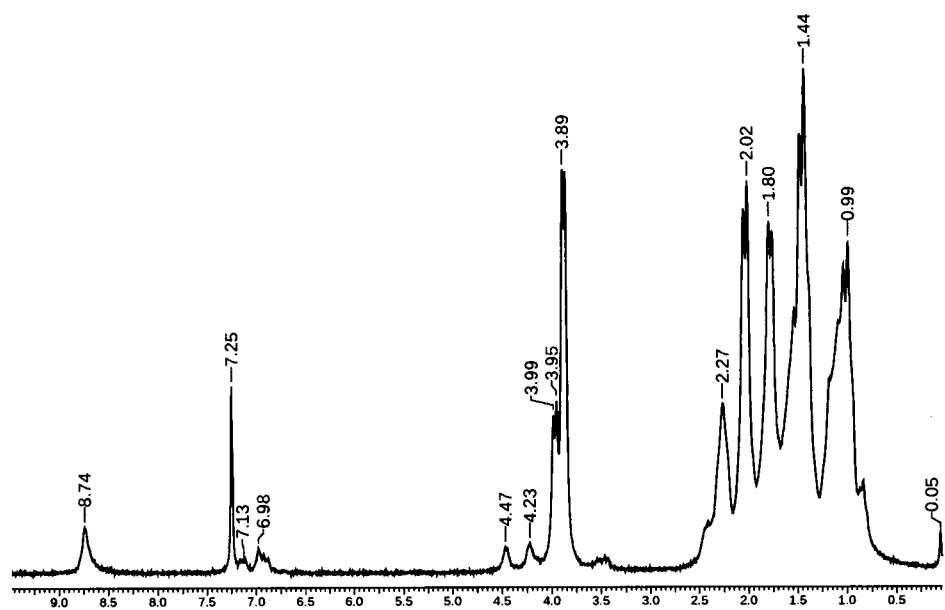
FIG. 3 depicts $^1$H NMR spectra of B91 recorded in CDCl$_3$
Figure 4:
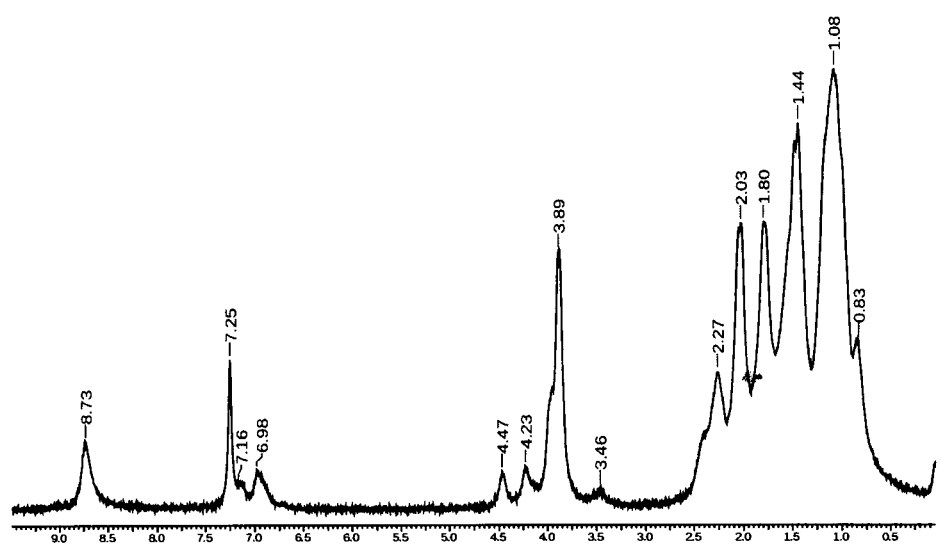
FIG. 4 depicts $^1$H NMR spectra of B82 recorded in CDCl$_3$.
Figure 5:
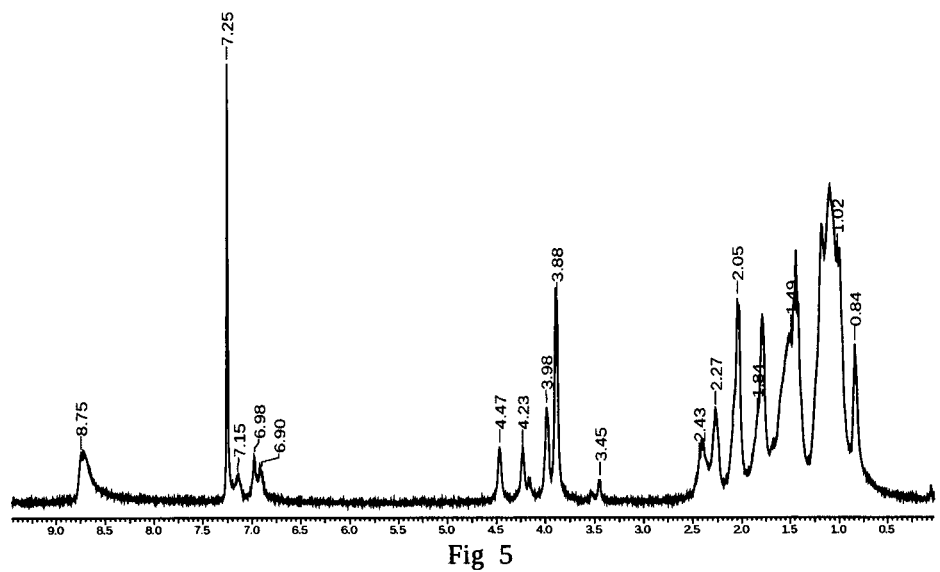
FIG. 5 depicts $^1$H NMR spectra of B73 recorded in CDCl$_3$
Figure 6:
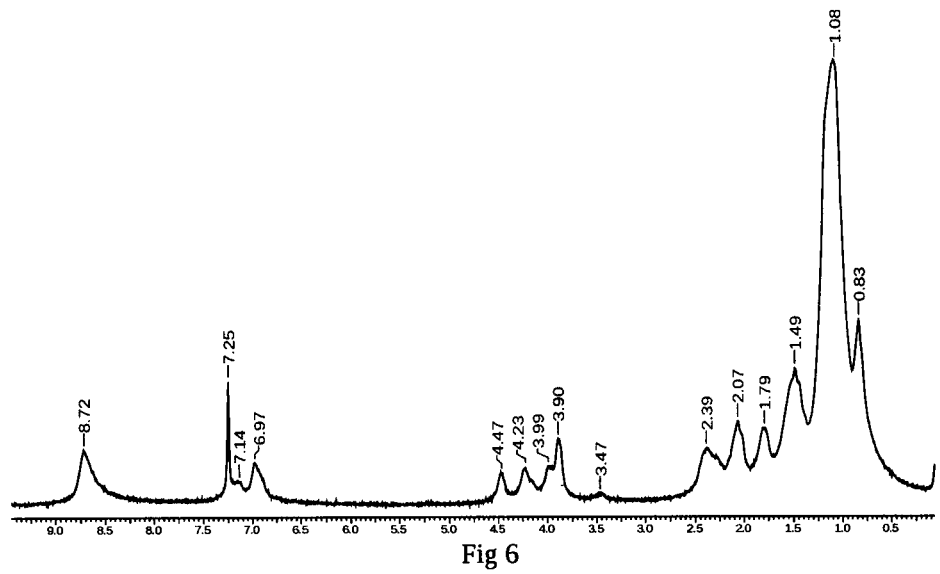
FIG. 6 depicts $^1$H NMR spectra of B11 recorded in CDCl$_3$

$^1$H NMR Spectroscopy:

The $^1$H NMR spectrum of PCCD shows two doublets at 4.00 and 3.91 ppm corresponding to the cis- and trans-isomeric protons in the ester linkage —COO—$CH_2$ in PCCD. The peaks from 2.5 to 0.9 ppm correspond to the protons in the cycloaliphatic rings in PCCD (FIG. 1). The $CH_2$—$CH_2$—OH peak from PBI diol found at 4.03 and 4.17 ppm (FIG. 2). In B91, B82, B73 and B11, —$CH_2$—$CH_2$—OH peak from PBI diol shifted up field from 4.03 to 4.23 and 4.17 to 4.47 respectively (FIG. 3-6). The formation of the new trans-ester linkage involving PBI was confirmed by shift of the —$CH_2$—OH proton in the proton NMR spectra, which transformed into the new —$CH_2$—O—COR linkage Compositional Analysis from $^1$H NMR Spectroscopy:

The composition analysis of PBI/PCCD copolymers were performed using $^1$H NMR through a comparison of the integral areas of the peaks in the aromatic region (perylene protons, 8.75 ppm) in Per PDP-2-Diol and the peak corresponding to the —COO—$CH_2$ (4.00 and 3.91 ppm) in PCCD. The mol % of PBI incorporated in PCCD/PBI 10, 20, 30 and 50 were 6, 12.5, 21 and 35% respectively which is shown in Table 1.

Molecular Weight:

The molecular weights of the PCCD and PCCD/PBI copolymers were determined using GPC in chloroform using polystyrene as standard. The inherent viscosity (flinh) of the polymers was measured for 0.5 wt % polymer solutions in mixture of 60/40 phenol/tetrachloroethane as a solvent (I0 mL The polymer solutions were filtered before the measurement, and three readings were taken on average for the calculation. The molecular weights and viscosities of the polymers were reported in Table 1.

Figure 7:
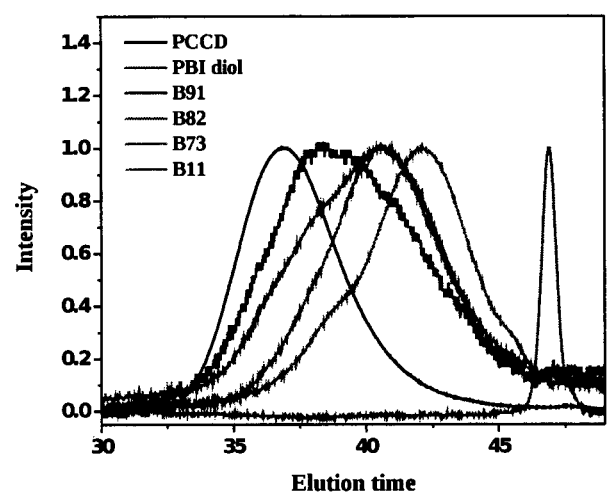
FIG. 7 depicts GPC of PCCD, PBI diol, B91, B82, B73 and B11 recorded in chloroform.

GPC Studies:

GPC of blends after solvent extraction showed that, the small molecular weight fraction corresponding to PBI diol which are physically trapped in polymer voids were removed by solvent extraction (FIG. 7)

Figure 8:
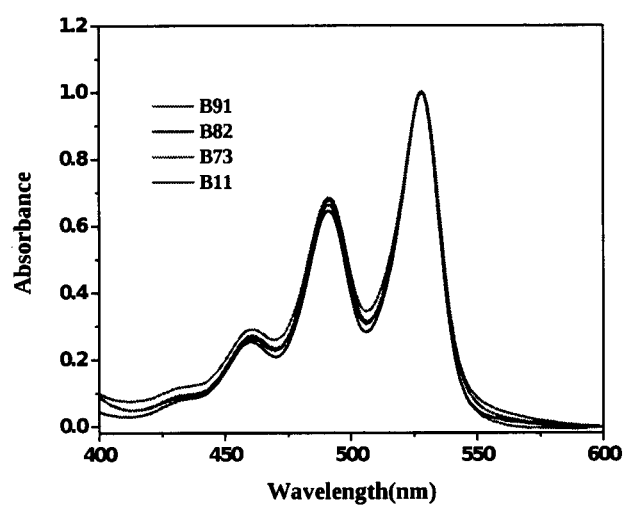
FIG. 8 describes UV/Vis spectra of PBI diol, B91 and B82 in CHCl$_3$

Photo Physical Properties:

The absorption spectra of PBI diol and copolymers were measured in chloroform solution. It shows three pronounced peaks in the range of 450-530 nm and a shoulder at 425 nm which corresponds to the 0-0, 0-1, 0-2 and 0-3 electronic transitions respectively (FIG. 8).

Figure 9:
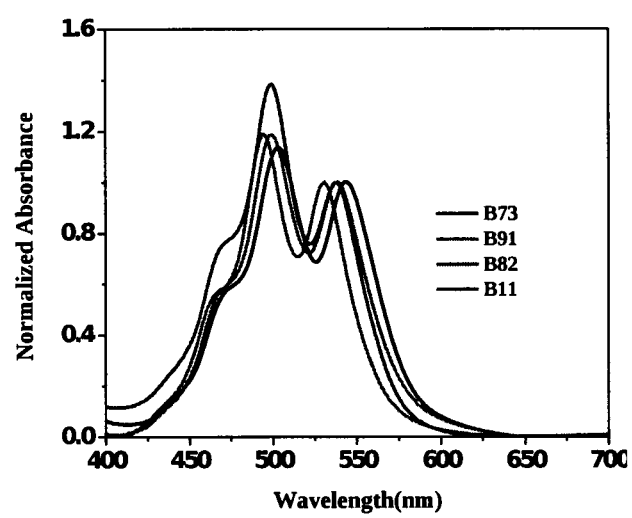
FIG. 9 depicts UV/Vis spectra of PBI diol, B91 and B82 films spin coated from CHCl$_3$ solution
Figure 10:
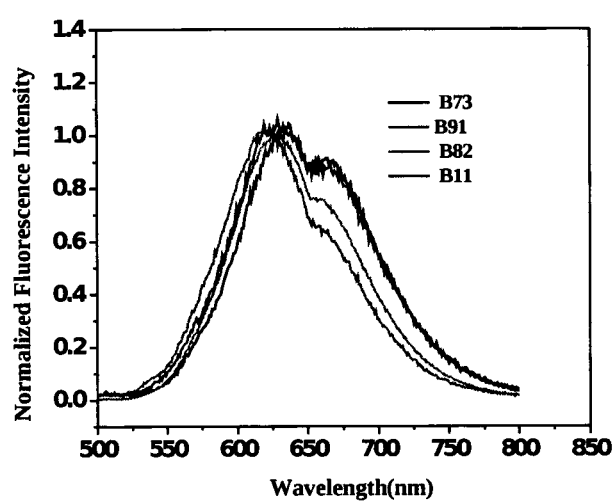
FIG. 10 depicts Normalized fluorescence spectra of PBI diol, B91 and B82 films (0.1 OD) spin coated from CHCl$_3$ solution
FIG. 11(a) Photograph of B91 film casted from chloroform
FIG. 11(b) Photograph of B82 film casted from chloroform

The combined absorption spectra of films spin coated from chloroform are shown in FIG. 9. The absorption spectrum of thin films was broad and $\lambda_{max}$ was blue shifted. This indicated the formation of H-aggregates in solid state. The quenching of fluorescence in films also supported the strong aggregation present in the system.

Figure 11A:
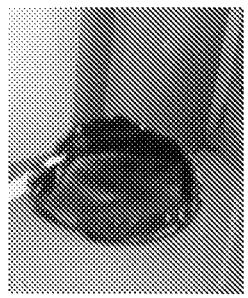
Figure 11B:
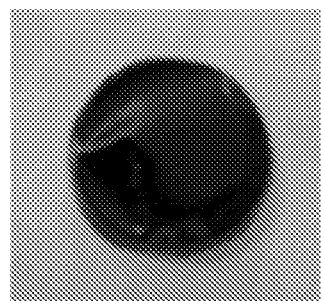

Table 1. Mol % of PBI incorporated (from '$H$ NMR), Molecular weights and Inherent viscosities of PCCD/PBI bends Film Casting Free-standing films could be formed for B91 and B82 from its chloroform solution signifying the high molecular weight nature. Such free-standing drop-cast film of PSB6 and PSB12.5 is shown in FIGS. 11(a) and (b).

ADVANTAGES OF PRESENT INVENTION

1. A thermoplastic polymer and perylenebisimide composition which is soluble in organic solvents.
2. The composition is amenable to be used in spin coating processes for applications in solar cells.

The invention claimed is:
1. A copolymer obtained by transesterification of a polyester with a perylenebisimidediol, and wherein said polyester is Poly(1,4-cyclohexylenedimethylene-1,4-cyclohexanedicarboxylate).
2. The copolymer as claimed in claim 1, wherein said polyester is Poly(1,4-cyclohexylenedimethylene-1,4-cyclohexanedicarboxylate) to perylenebisimide is in a ratio in the range of 90:10 to 10:90.
3. A process for the preparation of a copolymer composition comprising the steps of:
   a. dissolving a polyester in a solvent by heating to 150° C. to 180° C.;
   b. adding perylenebisimide (PBI) diol to the solution of step (a);
   c. stirring the mixture of step (b) for 10-12 hours;
   d. adding $Ti(OBu)_4$ to the solution of step (c) and continuing the reaction with stirring at 180 to 190° C. for 20 to 24 hrs to obtain a perylenebisimide-polyester copolymer;
   e. cooling the perylenebisimide-polyester copolymer as obtained in step (d) followed by adding dichloromethane and subsequently pouring the obtained poly- mer solution into an excess of ethanol followed by washing with methanol and solvent extraction with acetone to obtain the copolymer.

4. The process as claimed in claim 3, wherein the solvent used in step (a) is o-dichlorobenzene.

5. The process as claimed in claim 3, wherein the polyester used in step (a) is Poly(1,4-cyclohexylenedimethylene-1,4-cyclohexanedicarboxylate).

6. The process as claimed in claim 3, wherein the polymer composition comprises the thermoplastic polymer and perylenebisimide in the ratio 0.01:99.99 to 99.99:0.01.

* * * * *